United States Patent
Koyanagi

(10) Patent No.: US 7,400,676 B2
(45) Date of Patent: Jul. 15, 2008

(54) TONE QUALITY ADJUSTMENT DEVICE DESIGNING METHOD AND DESIGNING DEVICE, TONE QUALITY ADJUSTMENT DEVICE DESIGNING PROGRAM, AND TONE QUALITY ADJUSTMENT DEVICE

(75) Inventor: Yukio Koyanagi, Saitama (JP)

(73) Assignee: Neuro Solution Corp. (JP)

( * ) Notice: Subject to any disclaimer, the term of this patent is extended or adjusted under 35 U.S.C. 154(b) by 555 days.

(21) Appl. No.: 10/979,733

(22) Filed: Nov. 3, 2004

(65) Prior Publication Data

US 2005/0111562 A1    May 26, 2005

Related U.S. Application Data

(63) Continuation of application No. PCT/JP03/05263, filed on Apr. 24, 2003.

(30) Foreign Application Priority Data

May 9, 2002    (JP) .............. 2002-134572

(51) Int. Cl.
*H03H 7/40* (2006.01)
(52) U.S. Cl. .................. 375/232; 370/525
(58) Field of Classification Search ............ 375/229, 375/230, 232, 233, 234; 370/464, 498, 522, 370/525, 526
See application file for complete search history.

(56) References Cited

U.S. PATENT DOCUMENTS 4,453,256 A * 6/1984 Ryu .................... 375/235

FOREIGN PATENT DOCUMENTS

| JP | 61-096817 | 5/1986 |
| JP | 63-234617 | 9/1988 |
| JP | 05-259783 | 10/1993 |
| JP | 07-066685 | 3/1995 |
| JP | 10-079644 | 3/1998 |
| JP | 2001-273278 | 10/2001 |

* cited by examiner

*Primary Examiner*—Chieh M. Fan
*Assistant Examiner*—Naheed Ejaz
(74) *Attorney, Agent, or Firm*—Connolly Bove Lodge & Hutz LLP; Myron Keith Wyche

(57) ABSTRACT

A waveform of a desired frequency characteristic is input as a numeric value string and is subjected to a reverse FFT so as to obtain a filter coefficient group. Thus, without having any expert knowledge and only by inputting a waveform of a desired frequency characteristic as an image, it is possible to easily design a first FIR filter constituting a tone quality adjustment device. Moreover, by performing a predetermined calculation on the numeric value string input and performing a reverse FFT on the result, it is possible to easily design a second FIR filter having a frequency characteristic symmetric to the first FIR filter with respect to the gain reference value as an axis.

14 Claims, 10 Drawing Sheets

FIG. 5
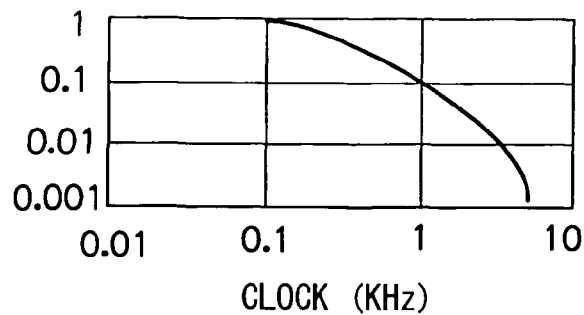
FIG. 6
| m | MAXIMUM FREQUENCY ERROR (Hz) |
|---|---|
| 1024 | 43 |
| 2048 | 22 |
| 4096 | 11 |
| 8192 | 5 |
| 16384 | 3 |
FIG. 7
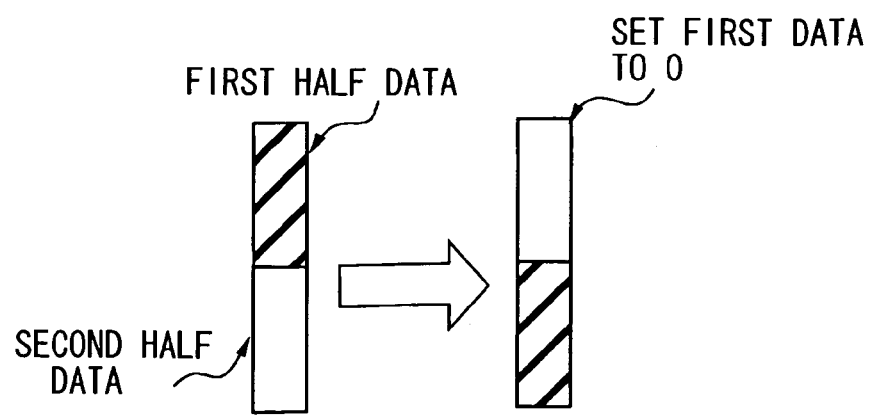

FIG. 8

| "1" | LPF1 | LPF2 | HPF1 | HPF2 |
|---|---|---|---|---|
| 0 | 0.0004883 | 0 | 0 | 0 |
| 0 | 0.0004883 | 0 | 0 | 0 |
| 0 | 0.0009766 | 0.0004883 | 0 | 0 |
| 0 | 0.0009766 | 0.0004883 | 0 | 0 |
| 0 | 0.0014648 | 0.0004883 | 0 | 0 |
| 0 | 0.0024414 | 0.0009766 | 0 | 0 |
| 0 | 0.0029297 | 0.0014648 | 0 | 0 |
| 0 | 0.003418 | 0.0019531 | 0 | 0 |
| 0 | 0.0043945 | 0.0024414 | 0 | 0 |
| 0 | 0.0053711 | 0.0029297 | 0 | 0 |
| 0 | 0.0063477 | 0.003418 | 0 | 0 |
| 0 | 0.0078125 | 0.0039063 | 0 | 0 |
| 0 | 0.0087891 | 0.0048828 | 0 | 0 |
| 0 | 0.0102539 | 0.0063477 | 0 | 0 |
| 0 | 0.012207 | 0.0078125 | 0 | 0 |
| 0 | 0.0136719 | 0.0097656 | 0 | 0 |
| 0 | 0.015625 | 0.012207 | 0 | 0 |
| 0 | 0.0180664 | 0.0141602 | 0 | 0 |
| 0 | 0.0200195 | 0.0161133 | 0 | 0 |
| 0 | 0.0214844 | 0.0180664 | 0 | 0 |
| 0 | 0.0234375 | 0.0200195 | 0 | 0 |
| 0 | 0.0253906 | 0.0224609 | 0 | 0 |
| 0 | 0.027832 | 0.0258789 | 0 | −0.0004883 |
| 0 | 0.03125 | 0.0307617 | 0 | −0.0039063 |
| 0 | 0.034668 | 0.0371094 | 0 | −0.0146484 |
| 0 | 0.0385742 | 0.0449219 | 0 | −0.0356445 |
| 0 | 0.0424805 | 0.0532227 | −0.01416016 | −0.0703125 |
| 0 | 0.0458984 | 0.0605469 | −0.09179688 | −0.1181641 |
| 0 | 0.0483398 | 0.0654297 | −0.23583984 | −0.1645508 |
| 1 | 0.0493164 | 0.0673828 | 0.68359375 | 0.81542969 |
| 0 | 0.0483398 | 0.0654297 | −0.23583984 | −0.1645508 |
| 0 | 0.0458984 | 0.0605469 | −0.09179688 | −0.1181641 |
| 0 | 0.0424805 | 0.0532227 | −0.01416016 | −0.0703125 |
| 0 | 0.0385742 | 0.0449219 | 0 | −0.0356445 |
| 0 | 0.034668 | 0.0371094 | 0 | −0.0146484 |
| 0 | 0.03125 | 0.0307617 | 0 | −0.0039063 |
| 0 | 0.027832 | 0.0258789 | 0 | −0.0004883 |
| 0 | 0.0253906 | 0.0224609 | 0 | 0 |
| 0 | 0.0234375 | 0.0200195 | 0 | 0 |
| 0 | 0.0214844 | 0.0180664 | 0 | 0 |
| 0 | 0.0200195 | 0.0161133 | 0 | 0 |
| 0 | 0.0180664 | 0.0141602 | 0 | 0 |
| 0 | 0.015625 | 0.012207 | 0 | 0 |
| 0 | 0.0136719 | 0.0097656 | 0 | 0 |
| 0 | 0.012207 | 0.0078125 | 0 | 0 |
| 0 | 0.0102539 | 0.0063477 | 0 | 0 |
| 0 | 0.0087891 | 0.0048828 | 0 | 0 |
| 0 | 0.0078125 | 0.0039063 | 0 | 0 |
| 0 | 0.0063477 | 0.003418 | 0 | 0 |
| 0 | 0.0053711 | 0.0029297 | 0 | 0 |
| 0 | 0.0043945 | 0.0024414 | 0 | 0 |
| 0 | 0.003418 | 0.0019531 | 0 | 0 |
| 0 | 0.0029297 | 0.0014648 | 0 | 0 |
| 0 | 0.0024414 | 0.0009766 | 0 | 0 |
| 0 | 0.0014648 | 0.0004883 | 0 | 0 |
| 0 | 0.0009766 | 0.0004883 | 0 | 0 |
| 0 | 0.0009766 | 0.0004883 | 0 | 0 |
| 0 | 0.0004883 | 0 | 0 | 0 |
| 0 | 0.0004883 | 0 | 0 | 0 |
| 0 | 0 | 0 | 0 | 0 |

| 12dB | 10dB | 8dB | 6dB | 4dB | 2dB | 0dB | -2dB | -4dB | -6dB | -8dB | -10dB | -12dB |
|---|---|---|---|---|---|---|---|---|---|---|---|---|
| 2.981 | 2.162 | 1.512 | 0.995 | 0.583 | 0.26 | 0 | -0.2 | -0.4 | -0.5 | -0.6 | -0.68 | -0.75 |

F I G. 1 1
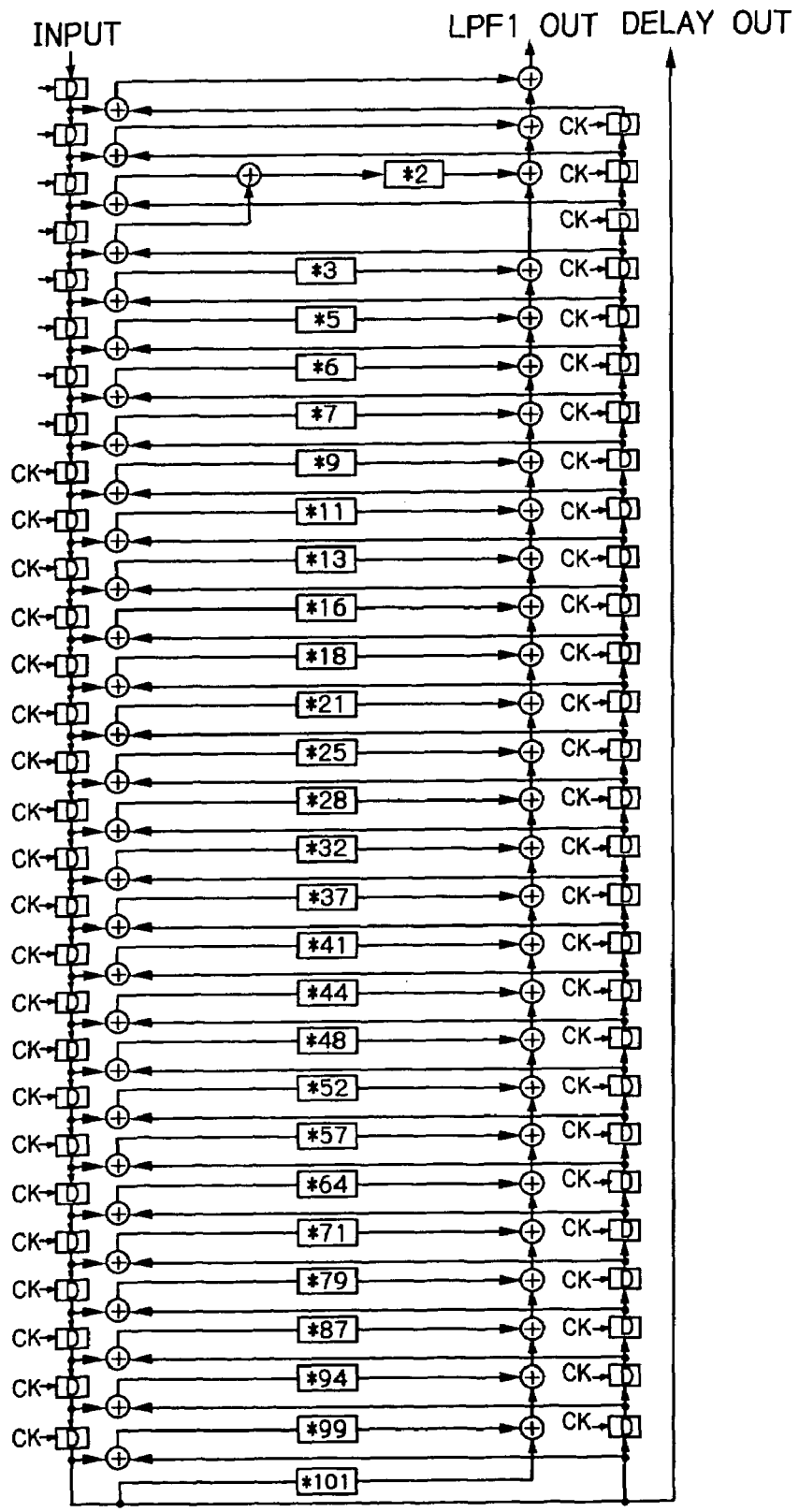

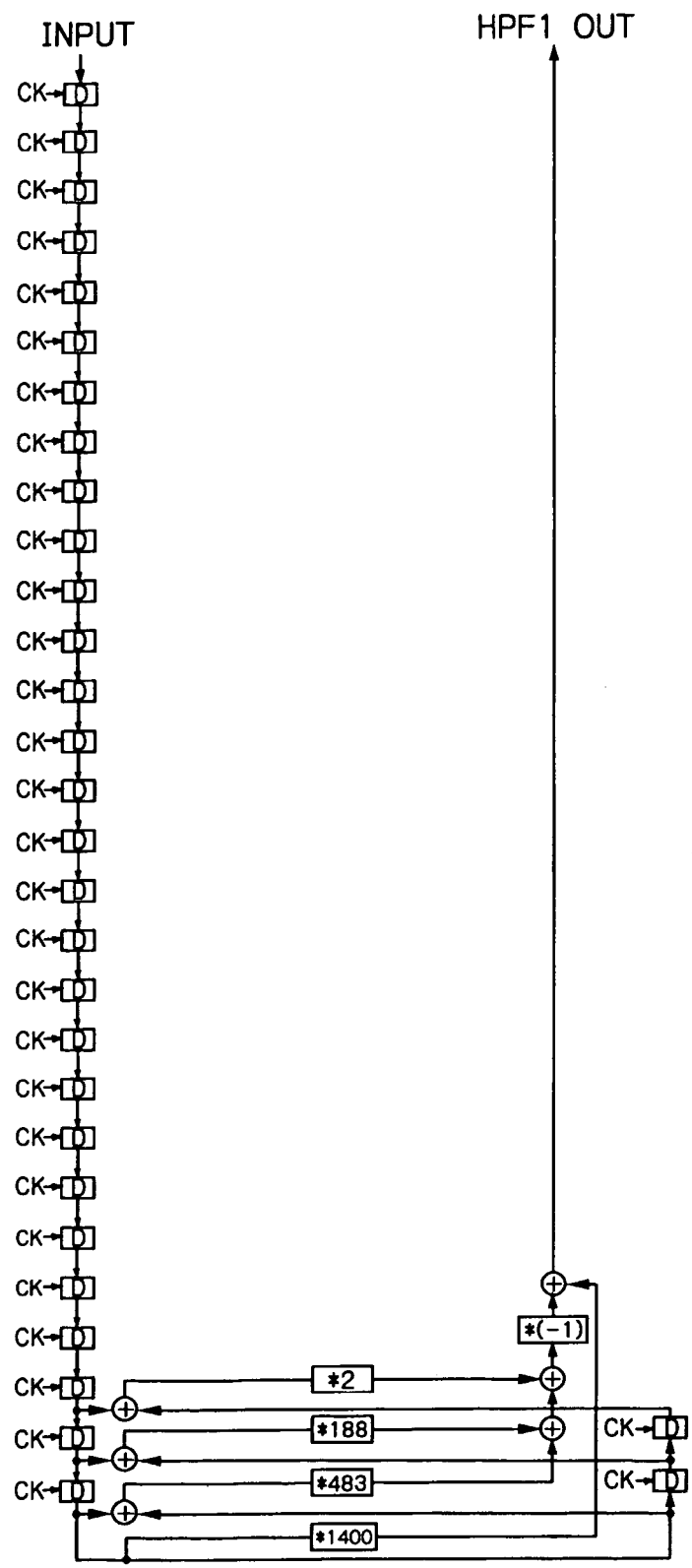
F I G. 1 3

TONE QUALITY ADJUSTMENT DEVICE DESIGNING METHOD AND DESIGNING DEVICE, TONE QUALITY ADJUSTMENT DEVICE DESIGNING PROGRAM, AND TONE QUALITY ADJUSTMENT DEVICE

CROSS-REFERENCE TO RELATED APPLICATIONS

This application is a U.S. Continuation of co-pending International Patent Application No. PCT/JP03/05263, filed on Apr. 24,2003 by KOYANAGI, Yukio. entitled TONE QUALITY ADJUSTMENT DEVICE DESIGNING METHOD AND DESIGNING DEVICE, TONE QUALITY ADJUSTMENT DEVICE DESIGNING PROGRAM, AND TONE QUALITY ADJUSTMENT DEVICE, the entire contents of which is incorporated by reference, and for which priority is claimed under 35 U.S.C. § 371. As in the parent International Application No. PCT/JP03/05263, priority is also claimed to co-pending Japan Patent Application No. 2002-134572, filed on May 9, 2002, the entire contents of which is incorporated by reference for which priority is claimed under 35 U.S.C. § 119.

FIELD OF THE INVENTION

The present invention relates to a tone quality adjustment device designing method and designing device, tone quality adjustment device designing program, and tone quality adjustment device, which is preferably applicable to a designing method of a device (equalizer) for improving tone quality by emphasizing or de-emphasizing a desired frequency band of a speech signal through digital signal processing in particular.

BACKGROUND OF THE INVENTION

Conventionally, there are various proposals on a method of improving tone quality of output speech of a device for outputting a speech signal. One of relatively simple methods thereof is a method of applying low pass filter processing and high pass filter processing to an input speech signal.

This type of tone quality adjustment device allows an input speech signal to pass through a low pass filter and a high pass filter, controls gains of an output signal and input speech signal of each filter and adds up all signals. At this time, by arbitrarily setting the gain for each filter output and the gain for the input speech signal, it is possible to arbitrarily emphasize a tone of a desired frequency band.

For example, to emphasize a tone in a low-frequency region (so-called low tone), the gain for the output signal of the low pass filter may be increased. On the other hand, to emphasize a tone in a high-frequency region (so-called high tone), the gain for the output signal of the high pass filter may be increased.

As filters used for this type of tone quality adjustment device, an IIR (Infinite Impulse Response: infinite length impulse response) filter and FIR (Finite Impulse Response: finite length impulse response) filter are often used. Among these filters, the FIR filter has the following advantages. First, since extreme values of a transfer function of the FIR filter exist only at the origin of the z-plane, the circuit is always stable. Second, a completely accurate linear phase characteristic can be realized.

The basis for these IIR filter and FIR filter is a low pass filter, and other filters such as high pass filter, band pass filter, band erasure filter, etc., are derived from the low pass filter by carrying out processing such as a frequency conversion. The frequency conversion processing here carries out a convolutional calculation using a window function and Chebyshev approximation method, etc., based on the ratio with respect to a sampling frequency and cutoff frequency to obtain a transfer function of the filter and further replaces the transfer function by a frequency component.

However, the above described conventional tone quality adjustment device filter designing method requires high-level expert knowledge of frequency conversion, etc., which results in a problem that it is not possible to design a tone quality adjustment device easily. On the other hand, the frequency conversion using a window function and Chebyshev approximation method involves very complicated calculations. For this reason, there has been a problem that realizing the frequency conversion by software results in a heavy processing load, while realizing the frequency conversion by hardware increases the scale of the circuit.

The present invention has been implemented to solve such problems and it is an object of the present invention to make it possible to simply design a tone quality adjustment device using a FIR digital filter.

SUMMARY OF THE INVENTION

In order to solve the above described problems, the present invention inputs a numeric value string or function expressing a desired frequency characteristic, carries out a reverse Fourier transform on the numeric value string or function input, extracts real number terms of the result, rearranges the first half portion and second half portion of the numeric value string consisting of the extracted real number terms, carries out rounding processing by multiplying the numeric value string consisting of the above described real number terms by $2^n$ (n: natural number), rounding off all digits to the right to the decimal point and multiplying the result by $½^n$, and determines the numeric value string obtained in this way as a filter coefficient group of a first filter constituting a tone quality adjustment device.

Furthermore, by carrying out a predetermined calculation on the above described numeric value string or function input, applying a reverse Fourier transform, rearrangement processing and rounding processing, a filter coefficient group of a second filter having a frequency characteristic symmetric to the above described first filter is obtained with respect to the gain reference value as an axis.

According to another aspect of the present invention, a numeric value string or function expressing a desired frequency characteristic and having a larger number of data points than the number of taps of a digital filter is input, the numeric value string or function input is subjected to a reverse Fourier transform, the real number terms of the result are extracted, the numeric value string consisting of the extracted real number terms is subjected to processing of rearranging the first half portion and the second half portion, the numeric value string consisting of the real number terms is subjected to processing of multiplying a predetermined window function and the numeric value string obtained in this way is determined as a filter coefficient group of a first filter constituting a tone quality adjustment device.

Furthermore, the numeric value string or function input is subjected to a predetermined calculation, the result is subjected to a reverse Fourier transform, rearrangement processing and windowing processing and a filter coefficient group of a second filter having a frequency characteristic symmetric to the first filter with respect to the reference value as an axis is thereby obtained.

BRIEF DESCRIPTION OF THE DRAWINGS

FIG. 5 illustrates an example of the desired frequency characteristic input in step S11 of FIG. 2;

FIG. 6 illustrates a relationship between an input data length m and maximum frequency error when an FIR filter targeted for a speech signal having a sampling frequency of 44.1 KHz is designed;

FIG. 7 illustrates the rearrangement processing in step S13 of FIG. 2;

FIG. 8 illustrates filter coefficient groups obtained from a numeric value string expressing a desired frequency characteristic by applying the designing method of this embodiment;

FIG. 11 illustrates a structure of the first low pass filter shown in FIG. 10;

FIG. 13 illustrates a structure of the first high pass filter shown in FIG. 10;

DETAILED DESCRIPTION OF THE PREFERRED EMBODIMENTS

With reference now to the attached drawings, an embodiment of the present invention will be explained below.

Figure 1:
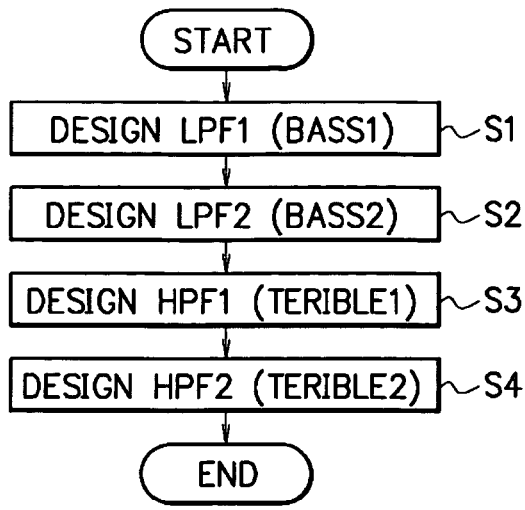
FIG. 1 is a flow chart showing a procedure of a tone quality adjustment device designing method according to this embodiment.
Figure 2:
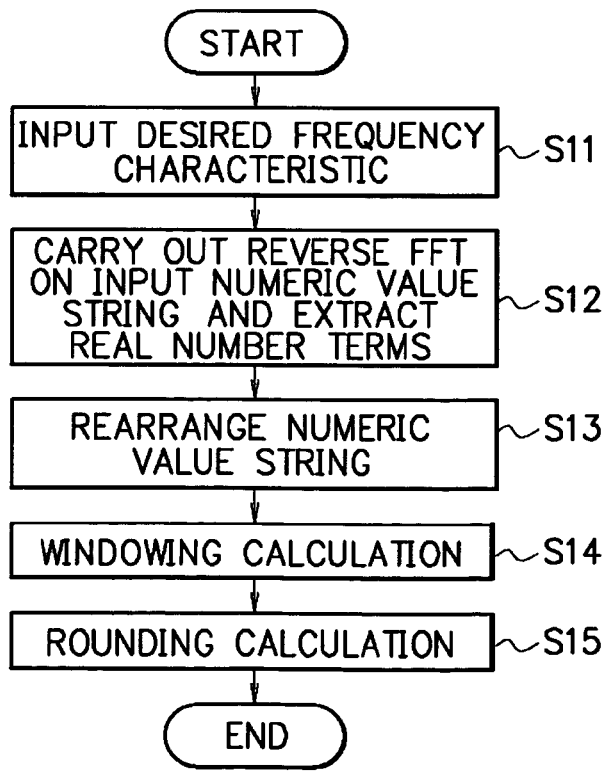
FIG. 2 is a flow chart showing a procedure of a digital filter designing method according to this embodiment.
Figure 3:
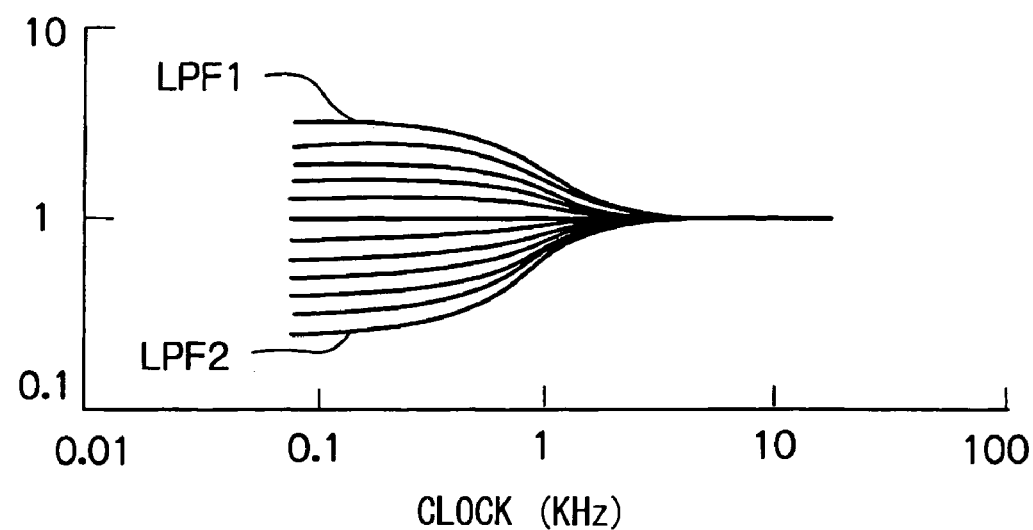
FIG. 3 illustrates an example of a frequency characteristic of a low pass filter to be designed.
Figure 4:
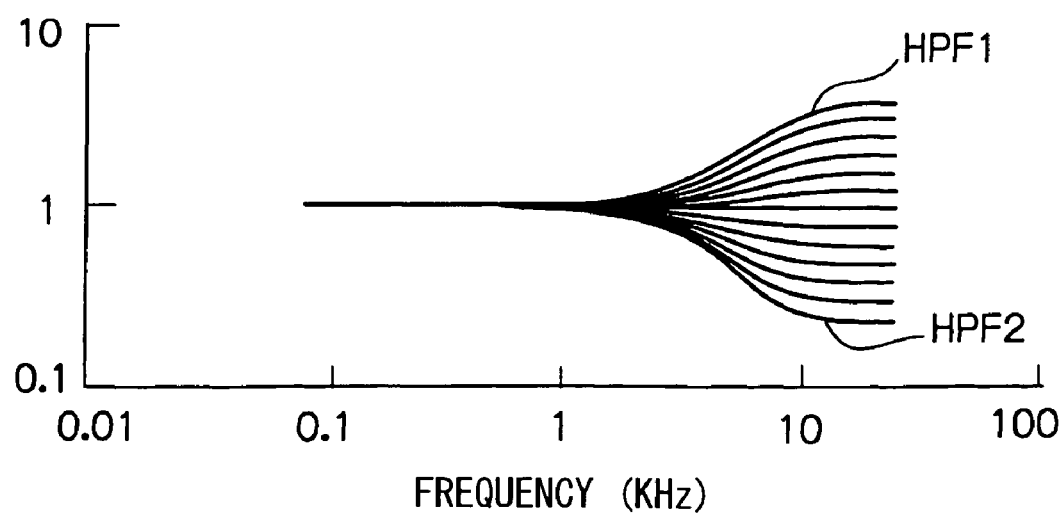
FIG. 4 illustrates an example of a frequency characteristic of a high pass filter to be designed.

FIG. 1 is a flow chart showing a procedure of a tone quality adjustment device designing method according to this embodiment, FIG. 2 is a flow chart showing a procedure of a digital filter designing method constituting the tone quality adjustment device according to this embodiment, FIG. 3 and FIG. 4 illustrate a frequency characteristic of a tone quality adjustment device to be designed. Note that in this frequency characteristic, both the frequency axis (horizontal axis) and gain axis (vertical axis) use a logarithmic scale.

The tone quality adjustment device designed in this embodiment is a type of tone quality adjustment device which applies low pass filter processing and high pass filter processing to an input speech signal, controls the gains of an output signal and input speech signal of each filter and adds up all signals. Therefore, the design of this tone quality adjustment device is performed by designing a low pass filter and high pass filter.

The filter designed here is a type of FIR filter which is provided with a tapped delay line made up of a plurality of delayers, multiplies the signal of each tap several times using a given filter coefficient group respectively, adds up the signals and outputs the sum. In the FIR filter, an impulse response expressed by a finite time length constitutes a filter coefficient as is. Therefore, designing an FIR filter means determining a filter coefficient group so as to obtain a desired frequency characteristic.

As shown in FIG. 1, a first low pass filter (BASS1) having a frequency characteristic which serves a basis of a low tone part is designed (step S1). This first low pass filter is a filter having a maximum amplitude (12 dB) in the positive direction with respect to a gain reference value 1 (0 dB) as shown in FIG. 3.

In this step S1, a first low pass filter is designed according to the procedure shown in FIG. 2. That is, a numeric value string expressing a waveform of a desired frequency characteristic is input (step S11). The numeric value string input at this time preferably has as many data pieces as possible. Originally, constructing an ideal filter requires an infinite number of filter coefficients and the number of filter taps should also be set to an infinite number. Therefore, to decrease an error with respect to a desired frequency characteristic, it is desirable to increase the number of input data pieces corresponding to the number of filter coefficients to such an extent that the frequency error falls within the necessary range. The numeric value string is input so that the number of data pieces is at least greater than the number of filter coefficients (number of digital filter taps) to be calculated.

More specifically, as shown in FIG. 5, a frequency-gain characteristic of the filter is drawn with the gain reference on a logarithmic scale set to "1" and converted to numeric data. The input data is arranged so as to be symmetric with respect to the center of the sampling frequency as an axis. At this time, the input data length (length of the graph, that is, the numeric value of the numeric value string) m is set to a value so that the frequency error falls within the necessary range, corresponding to $2^k$ for simplification of the reverse FFT processing in step S12.

For example, when an FIR filter targeted for a speech signal having a sampling frequency of 44.1 KHz is designed, the relationship between the input data length m and maximum frequency error is as shown in FIG. 6. The maximum frequency error referred to here corresponds to a frequency per scale of the graph and is obtained by a calculation of 44.1 KHz/m. The example of the graph shown in FIG. 5 shows a frequency characteristic corresponding to a low pass filter having an input data length m of 512.

For this data input, the respective numeric values may be entered directly or a waveform of a desired frequency characteristic may also be drawn on two-dimensional input coordinates to express a frequency-gain characteristic and the drawn waveform may be replaced by the corresponding numeric value string and entered. If the input technique in the latter case is used, it is possible to enter data while checking the desired frequency characteristic as an image and thereby make it intuitively easy to use the data input expressing the desired frequency characteristic.

There may be several means for realizing the input technique in the latter case. For example, there can be a method of displaying a two-dimensional plane which displays a frequency-gain characteristic on a display screen of a computer, drawing a waveform of a desired frequency characteristic on the two-dimensional plane through a GUI (Graphical User Interface), etc., and converting the frequency characteristic into numeric data. Or it is also possible to use a pointing device such as digitizer or plotter instead of the GUI on the computer screen. The techniques shown here are mere examples and numeric value strings may also be entered using other techniques. Here, the desired frequency characteristic is entered as a numeric value string, but the desired frequency characteristic may also be entered as a function expressing the waveform of the frequency characteristic.

Then, the frequency characteristic input in this way is subjected to a reverse Fourier transform (reverse FFT) as a transfer function and real number terms of the result are extracted (step S12). As is publicly known, when a certain numeric value string is subjected to a Fourier transform (FFT), a waveform of a desired frequency-gain characteristic corresponding to the numeric value string is obtained. Therefore, if a numeric value string or function expressing a waveform of a desired frequency-gain characteristic is input, subjected to a reverse FFT and the real number terms are extracted, an original numeric value string necessary to realize the frequency-gain characteristic can be obtained. This numeric value string corresponds to the filter coefficient group to be obtained.

However, the numeric value string calculated from a reverse FFT itself is not arranged in a sequence that can be used as a filter coefficient group as is. That is, irrespective of the type of a digital filter, the numeric value string of the filter coefficient has symmetry that a central value is largest and the value gradually decreases as the distance from the center increases while repeating fluctuations. On the contrary, the numeric value string calculated through a reverse FFT has the smallest central value and largest values at both ends.

Therefore, the numeric value string is divided into a first half part and second half part so that the central values of the numeric value string calculated by a reverse FFT are located at both ends and these parts are rearranged (step S13). That is, as shown in FIG. 7, a rearrangement is performed in such a way that the numeric value at the $0^{th}$ clock becomes the numeric value at the $256^{th}$ clock (hereinafter expressed as $0 \rightarrow 256$), $1 \rightarrow 257$, $2 \rightarrow 258$, ..., $255 \rightarrow 511$, $256 \rightarrow 0$, $257 \rightarrow 1$, ... $511 \rightarrow 255$ and in this way the central value becomes a maximum value and the first half part becomes symmetric to the second half part.

The numeric value string obtained in this way may also be determined as the filter coefficient group as is, but this embodiment further performs a windowing calculation (step S14). As described above, in the data input stage in step S11, the number of input data pieces is increased to an extent that an error with respect to a desired frequency characteristic falls within the necessary range. This number of input data pieces corresponds to the number of filter coefficients. Therefore, if the numeric value string calculated from this input data through processing such as a reverse FFT is used as the filter coefficient group as is, the number of taps of the digital filter increases considerably and the scale of the circuit also increases. Therefore, the number of taps is reduced to a necessary number by carrying out a windowing calculation.

As the window functions used here, there are various functions such as a square window, Hamming window, Hanning window, Hartley window. Any window function may be used, but the use of a Hanning window is particularly preferable. This is because the Hanning window is such a function that values at both ends of the window are 0 and values gradually attenuate from the central value toward both ends. For example, when a square window is used, the number of taps is forcibly truncated to a finite number, which causes ringing (undulation phenomenon) in the filter characteristic. On the contrary, instead of truncating the filter coefficient to a finite value, making the value gradually change to 0 can suppress generation of ringing.

Furthermore, the width of the window used at this time needs to be determined relative to the magnitude in the amount of attenuation of input data. In the case of the input data shown in FIG. 5, attenuation takes place gradually, and therefore the width before the Hanning window is truncated is set, for example, to 64. In step S14, the Hanning window of this width 64 (data string of 64 pieces) is multiplied on the central part of the numeric value string (data string of 516 pieces) calculated by a rearrangement. At this time, all coefficients outside the range of the Hanning window are calculated as 0.

It is also possible to use the numeric value string obtained through such a windowing calculation as a filter coefficient group as is. However, the filter coefficient group obtained through a reverse FFT and windowing calculation has quite many digits to the right of the decimal point and is a set of complicated and random values. For this reason, using this numeric value string as the filter coefficient group as is causes the number of multipliers necessary for the digital filter to become enormous, which is unrealistic.

Thus, it is necessary to round off the filter coefficient by truncating digits to the right of the decimal point of the numeric value string. However, the rounding processing through simple truncation only reduces the number of digits of the resulting numeric value string, whereas the numeric value string still continues to be a set of complicated and random values, which still requires many multipliers. Furthermore, simple truncation deteriorates the accuracy of the filter coefficient group obtained and increases the error with respect to the desired frequency characteristic.

Thus, this embodiment carries out a rounding calculation which will be described below (step S15). That is, the numeric value string after windowing in step S14 is multiplied by $2^n$ (n: natural number, e.g., n=2048), the digits to the right of the decimal point is rounded off (converted to an integer) and the result is multiplied by $\frac{1}{2^n}$.

According to such a rounding calculation, all filter coefficients are arranged to have a value of an integer multiple of $\frac{1}{2^n}$. Thus, it is possible to construct the digital filter in such a way that the integer multiple portion is separately multiplied on a signal from each tap of a digital filter, all the respective multiplication outputs are added up and then multiplied by $\frac{1}{2^n}$ all together. Moreover, the integer multiple part can be expressed by an addition of binary numbers such as $2^i + 2^j + ...$ (i, j: arbitrary integers).

In this way, it is possible to drastically reduce the number of multiplies used as the overall digital filter and simplify the structure. Furthermore, since the numeric value string obtained through a reverse FFT is multiplied by $2^n$ and then rounded off, it is possible to reduce rounding errors compared to the case where the digits to the right of the decimal point of the numeric value string are simply rounded off. This makes it to possible to simplify the filter coefficient group without deteriorating the accuracy of the filter characteristic.

In this embodiment, the numeric value string obtained by such a rounding calculation is finally determined as a filter coefficient group. The above described processing in steps S13 to S15 need not necessarily be carried out in this order and may be carried out in any order in which a rounding calculation is at least carried out after a windowing calculation. For example, it is also possible to carry out a windowing calculation before a rearrangement. In this case, a Hanning window is multiplied in such a way that the coefficient values at both ends of the window are "1" and the coefficient value in the central part of the window is "0". By carrying out a windowing calculation at an early stage in a series of procedures, it is possible to reduce the number of data pieces used for subsequent calculations and reduce the processing load on the calculations.

The filter coefficient group (64 filter coefficients) calculated in this way realizes the frequency characteristic of input data as shown in FIG. 5 substantially accurately. Moreover, it is also possible to realize a phase characteristic as a linear and stable characteristic.

After a first low pass filter is designed as shown above, a second low pass filter (BASS2) will be designed next (step S2). This second low pass filter is a filter as shown in FIG. 3 having a maximum amplitude (−12 dB) in the negative direction with respect to the gain reference value 1 (0 dB) and has a characteristic linearly symmetric to the first low pass filter with the reference value 1 as an axis. This second low pass filter is also designed according to the procedure shown in the flow chart of FIG. 2.

On the LOG-LOG plane using a logarithmic scale on both the vertical and horizontal axes, suppose a curve f(x) above the reference value 1 is expressed by 1+g(x). Then, a curve f(x)' which is linearly symmetric to this curve f(x) with the reference value 1 as an axis is expressed by following Expression (1)

$$f(x)' = 1 - 1/(1+g(x)) \quad (1)$$

Then, in step S11, by substituting the numeric value string input to design the first low pass filter into Expression (1), input data for the second low pass filter is obtained. Then, by carrying out processing similar to that in steps S12 to S15 on this input data, the filter coefficient group of the second low pass filter is obtained.

Furthermore, in the same manner as for the designing methods of the first and second low pass filters, a first and second high pass filters will be designed (step S3, S4). However, in designing the high pass filters, the width of the Hanning window used for the windowing calculation in step S14 is set to 8. In the case of the high pass filters, the amount of attenuation of real number terms resulting from a reverse FFT is large, and therefore it is possible to shorten the width of the window down to 8. Reducing the width of the window can also reduce the number of taps of the filter.

In the example of FIG. 1, the first and second high pass filters are designed after the first and second low pass filters are designed, but this order may be reversed. Moreover, in the example of FIG. 1, the second low pass filter or second high pass filter is designed after the first low pass filter or first high pass filter is designed, but this order may also be reversed.

FIG. 8 illustrates filter coefficient groups of the LPFs 1, 2 and HPFs 1, 2 obtained as described above. Using these filter coefficient groups, it is possible to form a filter block made up of one delay line for delaying an input speech signal and four FIR filters. Furthermore, by multiplying these filter coefficient groups by the coefficients shown in FIG. 9 and adding "1" thereto, it is possible to obtain the filter coefficient groups of tone quality adjustment devices in 2 dB units as shown in FIG. 3 and FIG. 4.

When the tone quality adjustment device designed in this way is actually constructed, if the filter coefficient groups shown in FIG. 8 are multiplied by 2048, all values become integers. This eliminates the necessity for using multipliers in the calculation of multiplying signals of the respective taps of the tapped delay lines made up of a plurality of delayers by filter coefficients and simply needs a structure with only bit shifters and adders. Furthermore, a divider which divides the numeric value after a sum-of-product calculation of the signals of the respective tap and filter coefficients by 2048 needs only to process lower 11 bits, and can thereby simplify the structure.

Figures 9, 10:
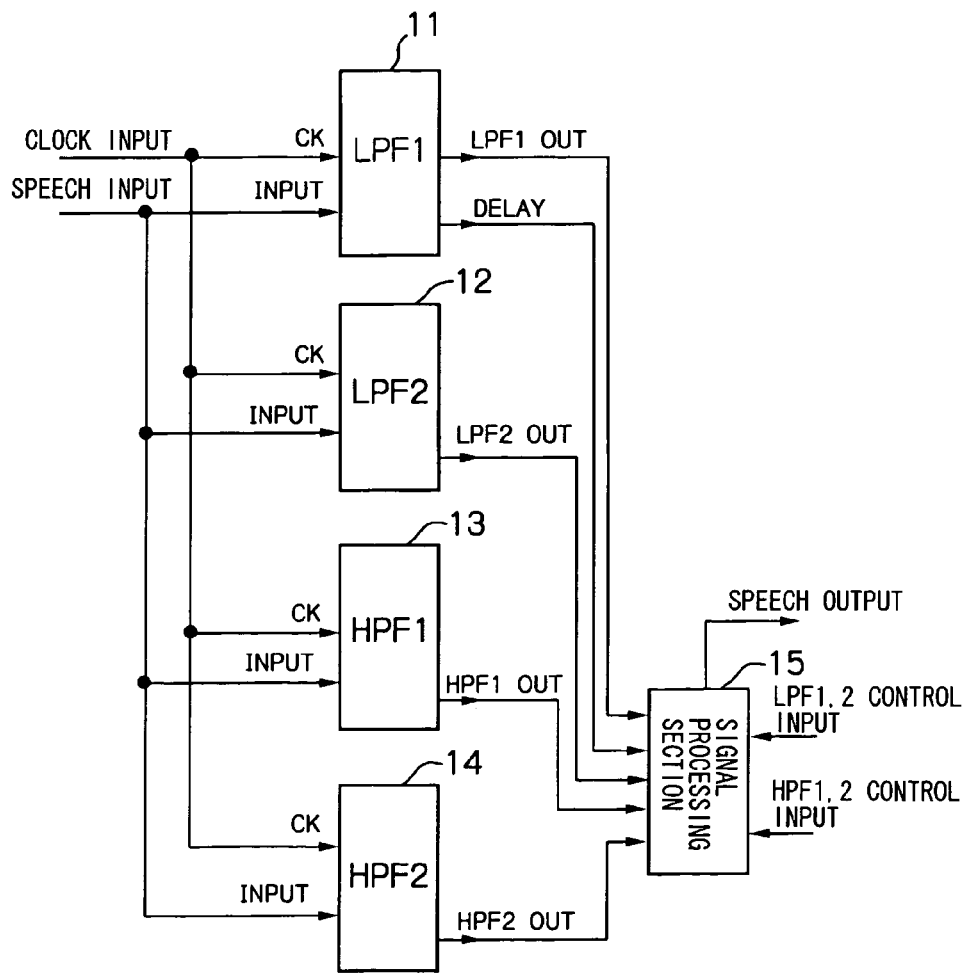
FIG. 9 illustrates coefficients used to obtain a filter coefficient group of the tone quality adjustment device in 2 dB units as shown in FIG. 3 and FIG. 4.
FIG. 10 illustrates an overall structure of a tone quality adjustment device according to this embodiment.

FIG. 10 shows an example of an overall structure of a tone quality adjustment device using the four filter blocks shown in FIG. 8. In FIG. 10, reference numerals 11 to 14 denote the first and second low pass filters, and the first and second high pass filters designed according to the procedure shown in FIG. 1 and FIG. 2. Of these filters, the first low pass filter 11 also serves as a delay line for an input speech signal. Reference numeral 15 denotes a signal processing section, which inputs signals output from the respective filters 11 to 14 (one delay line output and four filter outputs), controls their gains and outputs the signals.

FIG. 11 to FIG. 14 show internal structures of the four filters 11 to 14. These filters 11 to 14 use a plurality of vertically connected D type flip flops to cause an input signal to delay sequentially by one clock CK at a time. Then, signals extracted from the output taps of the respective D type flip flops are multiplied using a plurality of coefficient multipliers by the integer value of the result obtained by multiplying the filter coefficients by 2048 and all those multiplication results are added up using a plurality of adders and output. The first low pass filter 11 is provided with as many delay lines as input speech signals that pass through the plurality of D type flip flops.

Figure 15:
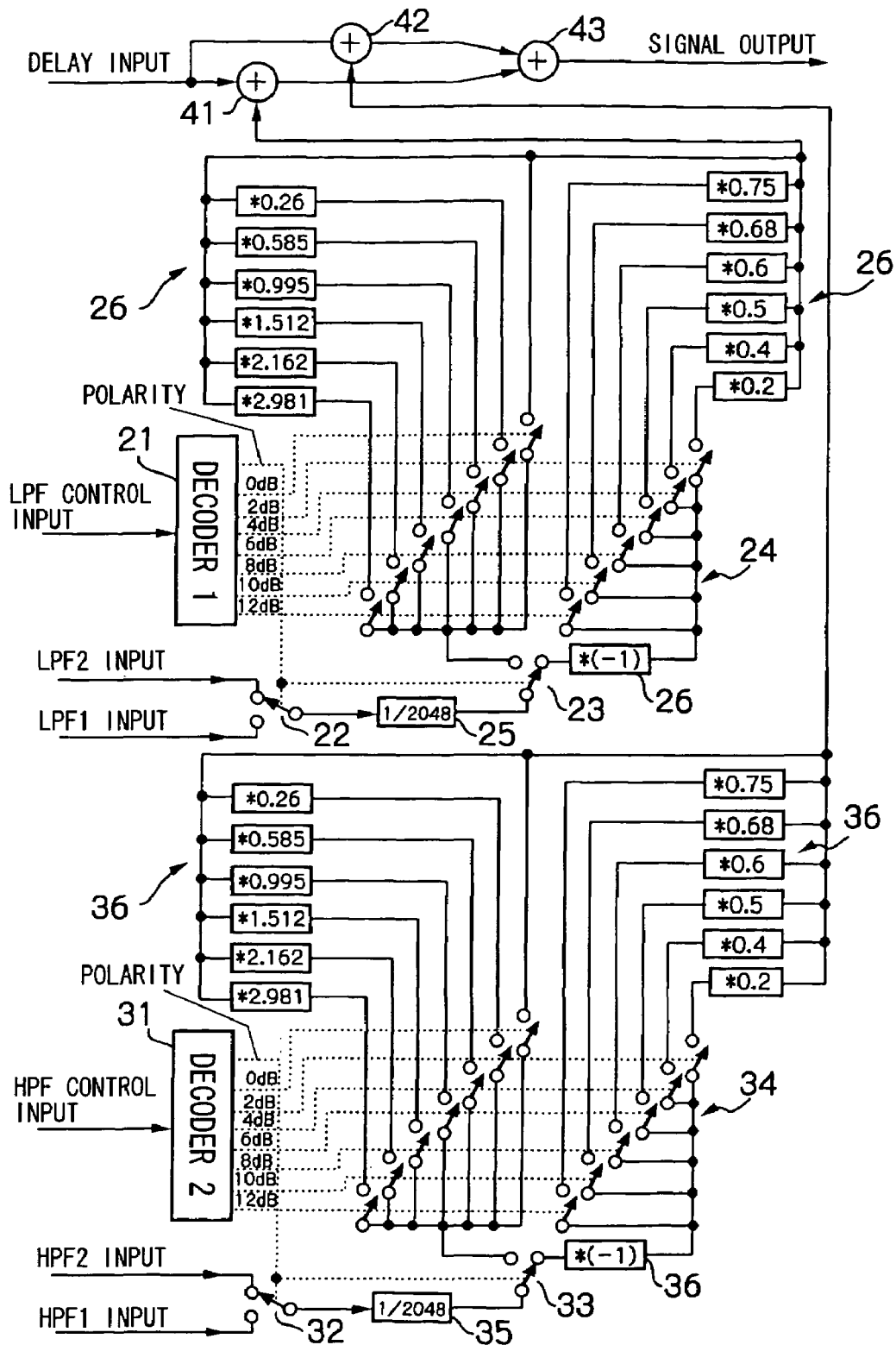
FIG. 15 illustrates a structure of the signal processing section shown in FIG. 10.

FIG. 15 shows an internal structure of the signal processing section 15. In FIG. 15, reference numeral 21 denotes a first decoder, which decodes gain control signals input from the first and second low pass filters 11, 12. Reference numerals 22 to 24 denote a plurality of switches, which perform switching operations based on the decoding result of the first decoder 21. Through these switching operations, any one of the output signals of the first and second low pass filters 11, 12 are selected and their gains are controlled.

Figure 12:
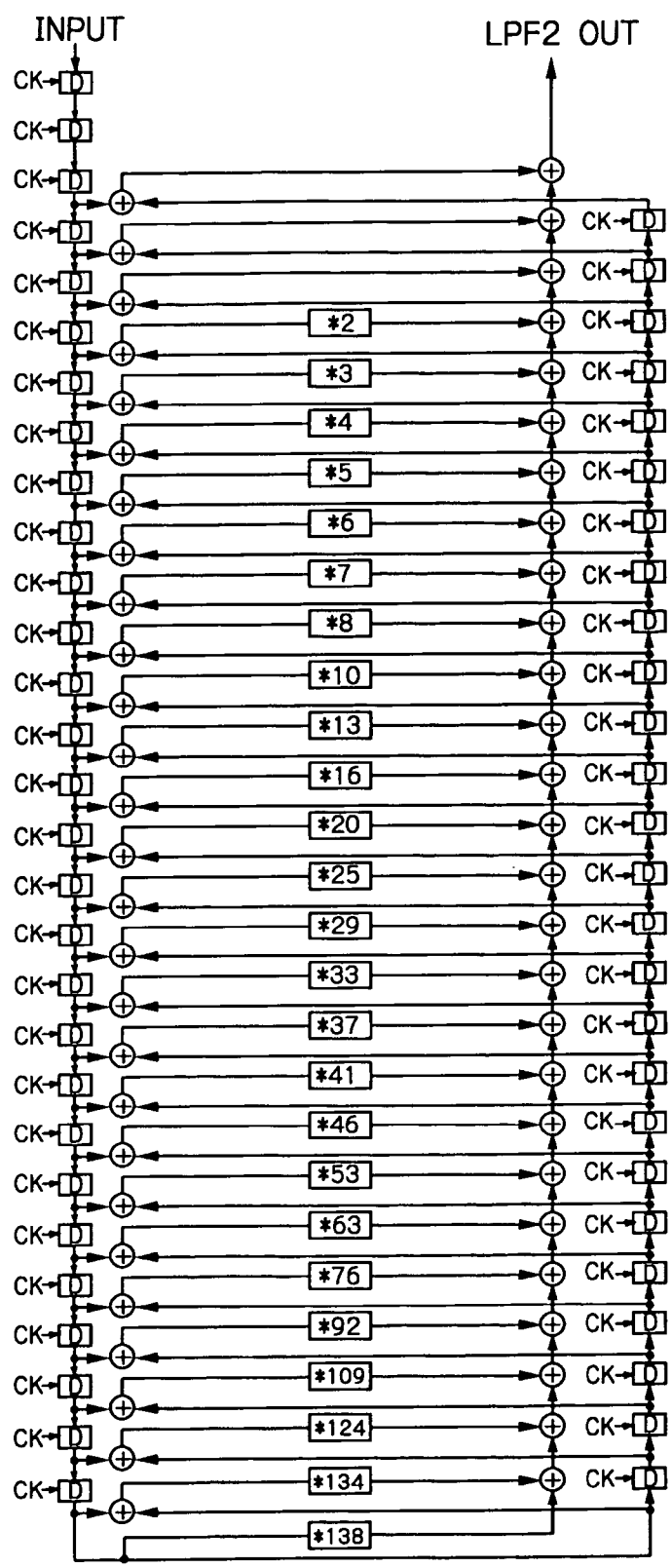
FIG. 12 illustrates a structure of the second low pass filter shown in FIG. 10.

Reference numeral 25 denotes a divider, which divides the signals which have passed through the switch 22 from the first and second low pass filters 11, 12 by 2048. As shown in FIG. 11 and FIG. 12, inside the first and second low pass filters 11, 12, the respective tap outputs are multiplied by the integer values of the results obtained by multiplying the filter coefficient groups shown in FIG. 8 by 2048. Thus, to restore the amplitude to a correct value, the divider 25 divides the filter output by 2048. Reference numeral 26 denotes a plurality of coefficient multipliers, which multiply the signals which have passed through the divider 25 by any one of the coefficient values shown in FIG. 9. Which coefficient should be multiplied is determined according to the decoding result by the first decoder 21.

Reference numeral 31 denotes a second decoder, which inputs and decodes the gain control signals of the first and second high pass filters 13, 14. Reference numerals 32 to 34 denote a plurality of switches, which perform switching operations based on the decoding result of the second decoder 31. Through these switching operations, any one of the output signals of the first and second high pass filters 13, 14 are selected and their gains are controlled.

Figure 14:
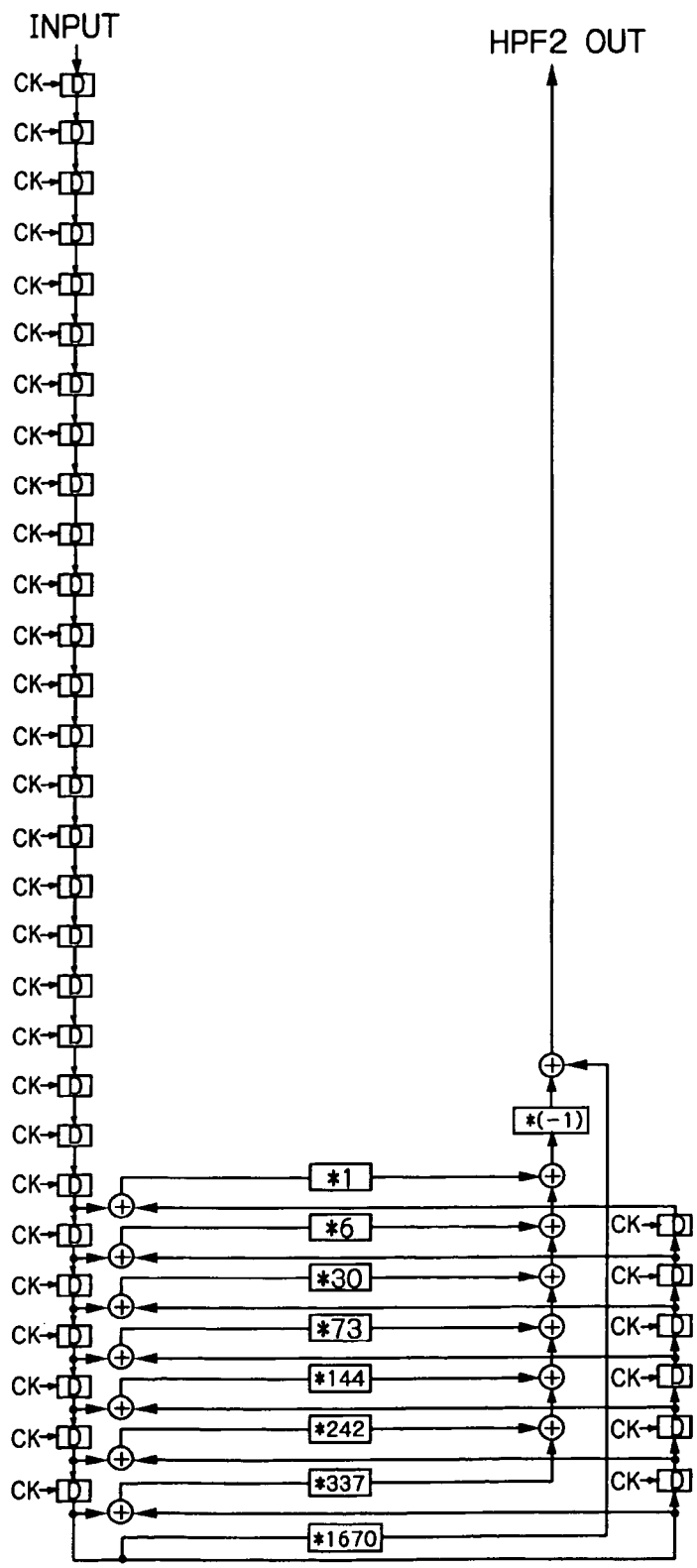
FIG. 14 illustrates a structure of the second high pass filter shown in FIG. 10.

Reference numeral 35 denotes a divider, which divides the signals which have passed the switch 32 through the first and second high pass filters 13, 14 by 2048. As shown in FIG. 13 and FIG. 14, inside the first and second high pass filters 13, 14, the respective tap outputs are multiplied by the integer values of the results obtained by multiplying the filter coefficient groups shown in FIG. 8 by 2048. Therefore, to restore the amplitude to a correct value, the filter output is divided by 2048 using the divider 35. Reference numeral 36 denotes a plurality of coefficient multipliers, which multiply signals which have passed through the divider 35 by any one of the coefficient values shown in FIG. 9. Which coefficient should be multiplied is determined according to the decoding result by the second decoder 31.

Reference numeral 41 denotes an adder, which adds up the speech signal input from the delay line of the first low pass filter 11 and the speech signal obtained by controlling the gain of the output of either the first or second low pass filter 11, 12. Reference numeral 42 denotes an adder, which adds up the speech signal input from the delay line of the first low pass filter 11 and the speech signal obtained by controlling the gain of the output of either the first or second high pass filter 13, 14. Reference numeral 43 denotes an adder, which adds up the outputs of the adders 41, 42 and outputs a speech signal whose tone quality is finally adjusted.

The device for realizing the tone quality adjustment device designing method according to this embodiment can be realized by any one of a hardware structure, DSP or software. When the device is realized by software, for example, the designing device of this embodiment is actually constructed of a CPU of a computer, MPU, RAM, or ROM, etc., and can be realized by causing a program stored in a RAM, ROM or hard disk, etc., to operate.

Therefore, the device can be realized by recording a program which causes a computer to operate so as to perform the functions of the above described embodiment in a recording medium such as a CD-ROM and causing the computer to read the program. As the recording medium for recording the program, it is possible to use not only a CD-ROM but also a flexible disk, hard disk, magnetic tape, optical disk, magneto-optical disk, DVD, non-volatile memory card, etc. The device can also be realized by downloading the above described program to a computer through a network such as the Internet.

Furthermore, not only in the case where the functions of the above described embodiment are realized by a computer executing the supplied program but also in the case where the program realizes the functions of the above described embodiment in cooperation with an OS (operating system) or other application software, etc., which is operating on the computer or in the case where all or part of the supplied program is processed by a functional expansion board or functional expansion unit of the computer, such a program is included in the embodiments of the present invention.

As explained above in detail, this embodiment inputs a numeric value string expressing a waveform of a desired frequency characteristic as an image, subjects this numeric value string to a reverse FFT to calculate filter coefficient groups of respective filters making up a tone quality adjustment device, and can thereby simply determine coefficients of an FIR digital filter which realizes a desired frequency characteristic even without special mathematical knowledge or electronic knowledge.

Furthermore, this embodiment carries out a special rounding calculation on a numeric value string calculated by a reverse Fourier transform, and can thereby simplify a filter coefficient group without deteriorating the accuracy of the filter and drastically reduce the number of multipliers (dividers) used which are the filter components. Furthermore, this embodiment multiplies the result of the reverse Fourier transform by a window function having a necessary length, and can thereby increase the input data length, suppress a frequency error to a small value and at the same time suppress the number of filter coefficients (number of taps of the digital filter) to a small value. This makes it possible to simplify the structure of the tone quality adjustment device to be designed and realize the desired frequency characteristic with a high degree of accuracy.

The above described embodiments are mere examples of implementing the present invention and these embodiments should not be interpreted as limiting the technological scope of the present invention. That is, the present invention can be implemented in various ways without departing from the spirit or main features thereof.

As described above, the present invention inputs a waveform of a desired frequency characteristic as a numeric value string or function, carries out processing such as a reverse Fourier transform on this and obtains a filter coefficient group of a first filter, performs a predetermined calculation on the numeric value string or function input, carries out processing such as a reverse Fourier transform to obtain a filter coefficient group of a second filter having a frequency characteristic symmetric to the first filter with the gain reference value as an axis, and can thereby simply design an FIR digital filter constituting a tone quality adjustment device without expert knowledge.

Furthermore, the present invention carries out a special rounding calculation on a numeric value string obtained through a reverse Fourier transform, and can thereby simplify the filter coefficient group to be calculated without degrading the accuracy of the filter characteristic and drastically reduce the number of multiplies used which are the filter components. This makes it possible to simply design a tone quality adjustment device capable of realizing a desired frequency characteristic using a small circuit scale with high accuracy.

Furthermore, the present invention carries out a windowing calculation on the result of a reverse Fourier transform, and can thereby increase the length of the first input numeric value string, suppress the frequency error to a small value and at the same time suppress the number of filter coefficients (number of taps of a digital filter) to a small value and simplify the structure of the digital filter to be designed. This makes it possible to simply design a tone quality adjustment device capable of realizing a desired frequency characteristic with a circuit in a small scale and with a high degree of accuracy.

INDUSTRIAL APPLICABILITY

The present invention is useful in simply designing a tone quality adjustment device using an FIR digital filter.

What is claimed is:

1. A tone quality adjustment device designing method using a type of digital filter which multiplies several fold signals of respective taps of tapped delay lines made up of a plurality of delayers by filter coefficient groups and adds up results of multiplication and outputs a sum, comprising:

inputting a numeric value string or function expressing a desired frequency characteristic, carrying out a reverse Fourier transform on said input numeric value string or function, extracting real number terms of a result of the reverse Fourier transform, rearranging a first half portion and second half portion of a numeric value string made up of said extracted real number terms, performing rounding processing of multiplying the numeric value string consisting of said real number terms by $2^n$ (n: natural number), rounding off all digits right a decimal point and multiplying a result of the rounding processing by $\frac{1}{2}^n$ (n: natural number), to generating an output numeric value string as a filter coefficient group of a first filter; and carrying out a predetermined calculation on said numeric value string or function input, applying said reverse Fourier transform, said rearrangement processing and said rounding processing on a result of the predetermined calculation so as to obtain a filter coefficient group of a second filter having a frequency characteristic symmetric to said first filter with respect to a gain reference value as an axis.

2. The tone quality adjustment device designing method according to claim 1, when said numeric value string or function input on a two-dimensional plane having both a frequency axis and the gain axis on a logarithmic scale is expressed by f(x)=1+g(x), said predetermined calculation carried out on said numeric value string or function input is f(x)'=1−1/(1+g(x)), wherein f(x) is said numeric value string or function expressing a curve above the reference value 1, g(x) is said numeric value or function obtained by horizontally shifting the f(x) by 1 and f(x)' is said numeric value string or function expression for a curve which is linearly symmetric to the f(x).

3. A tone quality adjustment device designing method using a type of digital filter which multiplies several fold signals of respective taps of tapped delay lines made up of a plurality of delayers by filter coefficient groups and adds up results of multiplication and outputs a sum, comprising:

inputting a numeric value string or function expressing a desired frequency characteristic and having a larger number of data points than a number of taps of said digital filter, carrying out a reverse Fourier transform on said numeric value string or function input, extracting real number terms of a result of the reverse Fourier transform, rearranging a first half portion and second half portion of a numeric value string made up of said extracted real number terms, processing of multiplying a predetermined window function on the numeric value string made up of said real number terms, to generating an output numeric value string as a filter coefficient group of a first filter; and carrying out a predetermined calculation on said numeric value string or function input, applying said reverse Fourier transform, said rearrangement processing and said windowing processing to a result of the predetermined calculation in order to obtain a filter coefficient group of a second filter having a frequency characteristic symmetric to said first filter with respect to a gain reference value as an axis.

4. The tone quality adjustment device designing method according to claim 3, further performing rounding processing of multiplying the numeric value string before or after the numeric value string made up of real number terms of the result of said reverse Fourier transform is rearranged or the numeric value string after being multiplied by said window function by $2^n$ (n: natural number) to round off digits to the right of the decimal point and multiplying a result of the rounding processing by $\frac{1}{2}^n$, a numeric value string or function expressing said desired frequency characteristic is input, subjected to a reverse Fourier transform, rearrangement processing, windowing processing and rounding processing to thereby obtain a filter coefficient group of said first filter, and a predetermined calculation is carried out on said numeric value string or function input, and subjected to said reverse Fourier transform, said rearrangement processing, said windowing processing and said rounding processing so as to obtain a filter coefficient group of said second filter.

5. The tone quality adjustment device designing method according to claim 3, when said numeric value string or function input on a two-dimensional plane having both a frequency axis and the gain axis on a logarithmic scale is expressed by f(x)=1+g(x), said predetermined calculation carried out on said numeric value string or function input is f(x)'=1−1/(1+g(x)), wherein f(x) is said numeric value string or function expressing a curve above the reference value 1, g(x) is said numeric value or function obtained by horizontally shift the f(x) by 1 and f(x)' is said numeric value string or function expression for a curve which is linearly symmetric to the f(x).

6. A designing device for a tone quality adjustment device using a type of digital filter which multiplies several fold signals of respective taps of tapped delay lines made up of a plurality of delayers by filter coefficient groups and adds up results of multiplication and outputs a sum, comprising:

input means for inputting a numeric value string or function expressing a waveform of a desired frequency characteristic; reverse Fourier transform means for subjecting the numeric value string or function input by said input means to a reverse Fourier transform and extracting real number terms of a result of the reverse Fourier transform;

rearrangement means for rearranging a first half portion and second half portion of the numeric value string obtained by said reverse Fourier transform; and rounding means for multiplying the numeric value string of said real number terms before or after being rearranged by said rearrangement means by $2^n$ (n: natural number), rounding digits to a right of a decimal point and multiplying a result of the rounding by $\frac{1}{2}^n$, wherein the numeric value string or function expressing the desired frequency characteristic input by said input means is subjected to processing by said reverse Fourier transform means, said rearrangement means and said rounding means to obtain a filter coefficient group of a first filter, a predetermined calculation is carried out on the numeric value string or function input by said input means, a result of the predetermined calculation subjected to processing by said reverse Fourier transform means, said rearrangement means and said rounding means so as to obtain a filter coefficient group of a second filter having a frequency characteristic symmetric to said first filter with respect to a gain reference value as an axis.

7. The tone quality adjustment device designing device according to claim 6, said input means comprising:

means for drawing a waveform of said desired frequency characteristic on two-dimensional input coordinates to express a frequency-gain characteristic; and means for inputting the drawn waveform as said numeric value string or function.

8. The tone quality adjustment device designing device according to claim 6, when said numeric value string or function input by said input means on a two-dimensional plane having both a frequency axis and the gain on a logarithmic scale is expressed by f(x)=1+g(x), said predetermined calculation carried out on said numeric value string or function input is f(x)'=1−1/(1+g(x)), wherein f(x) is said numeric value string or function expressing a curve above the reference value 1, g(x) is said numeric value or function obtained by horizontally shifting the f(x) by 1 and f(x)' is said numeric value string or function expression for a curve which is linearly symmetric to the f(x).

9. The designing device of claim 6, wherein the tone quality adjustment device comprises said first filter, said second filter; and a signal processing section which inputs signals output from said first filter and said second filter, controls the gains of the input signals, and outputs the gain-controlled signals.

10. A designing device for a tone quality adjustment device using a type of digital filter which multiplies severalfold signals of respective taps of tapped delay lines made up of a plurality of delayers by filter coefficient groups and adds up results of multiplication and outputs a sum, comprising:

input means for inputting a numeric value string or function expressing a waveform of a desired frequency characteristic having more data points than said digital filter taps;

reverse Fourier transform means for subjecting the numeric value string or function input by said input means to a reverse Fourier transform and extracting real number terms of a result of the reverse Fourier transforms;

rearrangement means for rearranging a first half portion and second half portion of the numeric value string obtained by said reverse Fourier transform; and windowing means for multiplying the numeric value string before or after being rearranged by said rearrangement means by wherein a predetermined window function, wherein the numeric value string or function expressing the desired frequency characteristic input by said input means is subjected to processing by said reverse Fourier transform means, said rearrangement means and said windowing means to obtain a filter coefficient group of a first filter, a predetermined calculation is carried out on the numeric value string or function input by said input means, a result of the predetermined calculation is subjected to processing by said reverse Fourier transform means, said rearrangement means and said windowing means to obtain a filter coefficient group of a second filter having a frequency characteristic symmetric to said first filter with a gain reference value as an axis.

11. The tone quality adjustment device designing device according to claim 10, further comprising rounding means for multiplying the numeric value string before or after being rearranged by said rearrangement means or the numeric value string after being subjected to windowing by said windowing means by $2^n$ (n: natural number) and rounding digits to the right of the decimal point and multiplying a result of the rounding by $½^n$, wherein the numeric value string or function expressing the desired frequency characteristic input by said input means is subjected to processing by said reverse Fourier transform means, said rearrangement means, said windowing means and said rounding means to obtain a filter coefficient group of said first filter, a predetermined calculation is carried out on the numeric value string or function input by said input means, a result of the predetermined calculation is subjected to processing by said reverse Fourier transform means, said rearrangement means, said windowing means and said rounding means so as to obtain a filter coefficient group of said second filter.

12. The tone quality adjustment device designing device according to claim 10, said input means comprising: means for drawing a waveform of said desired frequency characteristic on two-dimensional input coordinates to express a frequency-gain characteristic; and means for inputting the drawn waveform as said numeric value string or function.

13. The tone quality adjustment device designing device according to claim 10, when said input numeric value string or function on a two-dimensional plane having both a frequency axis and the gain axis on a logarithmic scale is expressed by $f(x)=1+g(x)$, said predetermined calculation carried out on said numeric value string or function input is $f(x)'=1-1/(1+g(x))$, wherein $f(x)$ is said numeric value string or function expressing a curve above the reference value 1, $g(x)$ is said numeric value or function obtained by horizontally shifting the $f(x)$ by 1 and $f(x)'$ is said numeric value string or function expression for a curve which is linearly symmetric to the $f(x)$.

14. The designing device of claim 10, wherein the tone quality adjustment device comprises said first filter, said second filter; and a signal processing section which inputs signals output from said first filter and said second filter, controls the gains of the input signals, and outputs the gain-controlled signals.

* * * * *